United States Patent [19]

Mishra et al.

[11] Patent Number: 5,780,355
[45] Date of Patent: Jul. 14, 1998

[54] UV ASSISTED GALLIUM NITRIDE GROWTH

[75] Inventors: Umesh Kumar Mishra, Santa Barbara; Steven P. DenBaars; Stacia Keller, both of Goleta, all of Calif.

[73] Assignee: The Regents of the University of California, Oakland, Calif.

[21] Appl. No.: 757,873

[22] Filed: Nov. 27, 1996

[51] Int. Cl.$^6$ ............................................. H01L 21/205
[52] U.S. Cl. .......................................... 438/483; 438/485
[58] Field of Search ............................ 437/126, 133, 437/127, 129, 107, 5; 148/DIG. 113; 427/582; 117/105; 438/432, 961, 796, 481, 483, 485, 487

[56] References Cited

U.S. PATENT DOCUMENTS

| | | | |
|---|---|---|---|
| 4,910,044 | 3/1990 | Yamazaki et al. | 427/582 |
| 5,210,051 | 5/1993 | Carter et al. | 437/107 |
| 5,585,648 | 12/1996 | Tischler | 257/77 |
| 5,633,192 | 5/1997 | Moustakas et al. | 438/46 |

FOREIGN PATENT DOCUMENTS 07291791  7/1995  Japan .

*Primary Examiner*—John Niebling
*Assistant Examiner*—S. Mulpuri
*Attorney, Agent, or Firm*—Merchant, Gould, Smith, Edell, Welter & Schmidt

[57] ABSTRACT

A method for producing Group III nitride films with high indium content and superior optical quality. The Group III nitride film will produce light in the ultraviolet, blue, green, yellow, and red spectral regions. This will enable fabrication of full-color displays and produce a reliable white light source. A metal organic chemical vapor deposition (MOCVD) process in combination with a photochemical process reduces the growth temperature required to produce optical quality Group III nitride films.

8 Claims, 1 Drawing Sheet

UV ASSISTED GALLIUM NITRIDE GROWTH

BACKGROUND OF THE INVENTION

1. Field of the Invention

Gallium nitride photonic and electronic devices are useful devices for visible displays and high power switching. This invention relates in general to a method of growing a Group III nitride on a substrate, and more particularly to a method for growing a Group III nitride alloy on a substrate with a high indium content and superior optical and electrical properties.

2. Description of Related Art

In the field of electronics, new materials are being used to perform previously unobtainable goals, e.g., blue emitters, new devices, smaller devices, and more efficient light emitting devices. The ability to grow or otherwise manufacture these new materials has been limited by the understanding of the chemistry that is occurring, the need for the finished devices, and the ability to mass produce such devices.

The devices result from different areas of study. The first area is the ability to actually grow the material onto a substrate. Several different types of growth techniques have been approached for various materials. The second area is the ability to process those materials once they are grown onto a substrate. Many materials that are now in their infancy take their growth and processing techniques from more established materials, e.g., silicon, gallium arsenide, and others.

The Group III (Al, Ga, In) nitrides are materials that are producing devices previously unavailable in the optoelectronics and electronics markets. For example, Gallium Nitride (GaN), when grown on a sapphire substrate produces illumination in the blue region (470 nm). These high efficiency and high reliability "blue diodes" cannot be made with any other materials currently known. A further development of materials, such as aluminum gallium nitride (AlGaN) produces ultraviolet light (200 nm), and indium gallium nitride (InGaN) can produce light in the 360 nm through 630 nm region.

These advances in the ability of a material to produce luminescence in those optical regions allow for the use of the electronics to take the place of typical lighting fixtures. Further, the use of blue and UV diodes in the recording industry for the recording of CD-ROMs instead of the red lasers (800 nm) currently being used in that industry allow for a up to ten times higher density of information per unit distance on a CD-ROM track. Production of Light Emitting Diodes (LEDs) which use a lens shaped protective cover allow for high intensity light at low power levels.

However, growing gallium nitride usually takes place at approximately 1050° C., which makes the growth process costly and possibly damaging the substrate, gallium nitride layer, and resultant structure. In addition, the high temperature causes dopant diffusion and poor heterojunction formation.

The uses for Gallium Nitride devices are especially attractive in the low power region. GaN diodes typically operate at drive voltages of five volts or less. Highly efficient devices are required for current applications that operate on battery power, since most portable electronics are constrained by the amount of available battery power that can be carried with the device.

It can seen then that there is a need for producing Group III nitride and alloys of Group III nitride devices for a reduced cost. It can also be seen that there is a need for the ability to produce Group III nitride devices in large quantities. It can also be seen that there is a need for growing gallium nitride at a reduced temperature.

SUMMARY OF THE INVENTION

To minimize the limitations in the prior art described above, and to minimize other limitations that will become apparent upon reading and understanding the present specification, the present invention discloses a powerful and highly productive system and method for making Group III nitride films that can then be made into electronic devices. The present invention is comprehensive and fully integrable with current processing techniques.

The present invention solves the above-described problems by providing a method for producing gallium nitride and alloys of gallium nitride on a substrate. The method uses ultraviolet (UV) emissions from mercury and xenon gas to assist in the gallium nitride growth. The use of UV light will significantly lower the growth temperature required for epitaxially grown gallium nitride and gallium nitride alloys. Further, the use of UV light will increase the growth rate of indium gallium nitride, and growth efficiency of the Metal-Oxide Chemical Vapor Deposition (MOCVD) process.

A method in accordance with the principles of the present invention comprises the steps of placing a substrate in a chamber, generating a microwave beam within the chamber perpendicular to the top of the substrate, introducing a reactant gas that flows into the microwave beam, thereby generating a plasma, introducing an inert gas into the microwave beam and the reactant gas that generates ultraviolet light, flowing a mixture of a gas and the reactant gas into the chamber whereby the plasma interacts with the mixture, and flowing a group III gas into the chamber across the top of the substrate, whereby the plasma interacts with the Group III gas.

One object of the present invention is to lower the growth temperature of the gallium nitride layers. Another object of the present invention is to increase the growth rate of gallium nitride. Another object of the present invention is to produce the Group III nitride devices cheaply and efficiently.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there is illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and article of manufacture for producing a layer of Group III nitride or alloy of Group III nitrides on an semiconductor substrate. The crystal growth of GaN can be reduced from 1000° C. to 600° C. with the method of the present invention. The reduction in growth temperatures arises because of the photolytic nature of the photons on adsorbed molecules. The remote plasma and photo-enhanced kinetics of the present invention allow the epitaxial growth of nitrides at significantly reduced temperatures.

Mercury and xenon gas will be used in the remote plasma as a means of increasing the UV photon yield at the GaN wafer surface. The xenon gas, when in a plasma, emits UV light. The UV emission lowers the activation energy of arsine ($AsH_3$) from 34 kcal/mole to 18 kcal/mole. This reduction in activation energy is also seen in ammonia ($NH_3$), which provides the nitrogen atom to form the nitride layer. Thus, a reduction in decomposition temperature for the ammonia molecule is achievable at the surface of the growth region.

Figure 1:
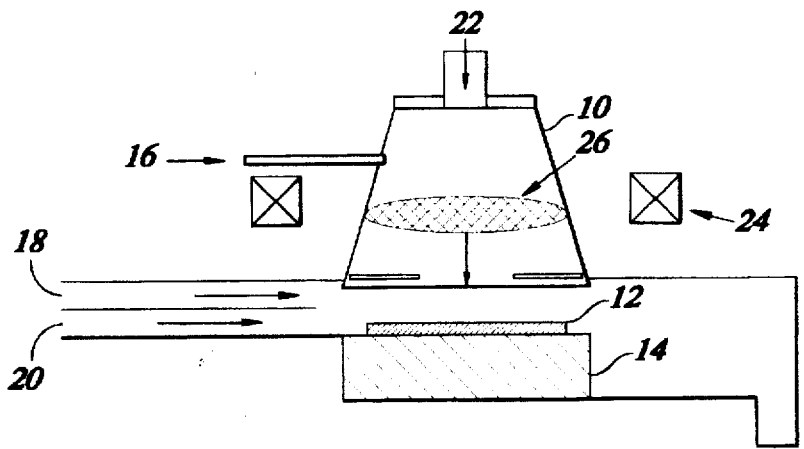
FIG. 1 is a diagram depicting the method of the invention.

FIG. 1 is a diagram depicting the method of the invention. Chamber 10 is shown containing substrate 12. Chamber 10 is typically a growth chamber. Substrate 12 is typically a sapphire substrate, but can be other materials. Susceptor 14 supports substrate 12. Susceptor 14 is typically heated to increase the temperature of substrate 12.

Inlet 16 enters chamber 10 at the side of but near the top of chamber 10. Inlet 16 usually introduces mercury or xenon gases into chamber 10. Inlet 10 usually provides gases to the chamber 10 at a pressure between 1 torr and 760 torr, but the pressure may be higher or lower. Xenon gas is used because the photon emissions from xenon are in the ultraviolet range, typically less than 360 nm, which is suitable to assist in disassociating the ammonia molecule. Other gases that can be used are mercury, neon, and argon.

Inlet 18 enters chamber 10 at the side of but near the bottom of chamber 10. Inlet 18 usually introduces nitrogen and ammonia gases into chamber 10. Inlet 18 allows gas to flow across the surface of substrate 12. Inlet 18 usually provides gases to the chamber 10 at a pressure between 1 torr and 760 torr, but the pressure may be higher or lower.

Inlet 20 enters chamber 10 at the side of but near the bottom of chamber 10. Inlet 20 usually introduces group III type gases into chamber 10. Inlet 18 allows gas to flow across the surface of substrate 12. Inlets 18 and 20 allow the ions that will be required to form gallium nitride to flow across the surface of substrate 12 and to be close to the surface of substrate 12. Inlet 20 usually provides gases to the chamber 10 at a pressure between 1 torr and 760 torr, but the pressure may be higher or lower.

Microwave energy 22 enters chamber 10 at the top of chamber 10. Microwave energy 22 is typically at 2.45 gigahertz, but can be at higher or lower frequencies. Magnetic coil 24 is wrapped around the outside of the chamber 10. Magnetic coil 24 usually provides a magnetic field of several Tesla, but the magnetic field can be higher or lower.

As microwave energy 22 enters the chamber 10 and travels towards the substrate 12, the magnetic coil 24 and the microwave energy 22 form a plasma 26 within the chamber 18. Microwave energy 22 and magnetic coil 24 assist in breaking up the ammonia gas molecules from inlet 18 into hydrogen and nitrogen ions. The plasma 26 contains these hydrogen and nitrogen ions. Further, microwave energy 22 and magnetic coil 24 assist in generating ultraviolet light emissions from the xenon gas coming from inlet 16. The ultraviolet light emissions assist in breaking up the ammonia molecules.

The plasma 26 is also formed near the surface of the substrate 12. The plasma 26 formed near the surface of the substrate 12 assists the gases in inlets 18 and 20 to form gallium nitride or alloys of gallium nitride on the surface of substrate 12. Because the plasma 26 generates ultraviolet light via the xenon ions from inlet 16, the temperature required for forming the gallium nitride on the surface of the substrate 12 is lower than that required without the plasma 26. The reason for the reduced temperature requirement is that the ultraviolet light lowers the activation energy of the ammonia molecules coming in from inlet 18. Once the activation energy is lowered, it is easier to break up the ammonia molecule into nitrogen atoms and hydrogen atoms, and therefore provides nitrogen atoms for the gallium or gallium alloy coming from inlet 20 to form the gallium nitride or alloy of gallium nitride on the surface of substrate 12. This reaction allows the temperature of susceptor 14 to be lower than the temperature required at susceptor 14 if the plasma 26 is not present.

The redox equations to generate the plasma and the resulting nitride are:

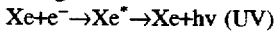
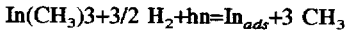
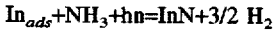

$Xe + e^- \rightarrow Xe^* \rightarrow Xe + h\nu$ (UV)
$In(CH_3)3 + 3/2\ H_2 + h\nu = In_{ads} + 3\ CH_3$
$In_{ads} + NH_3 + h\nu = InN + 3/2\ H_2$ where the indium is adsorbed onto the substrate 12 prior to combining with the nitrogen ion. Similar processes for gallium and gallium alloys will yield gallium nitride and gallium nitride alloys.

Figure 2:
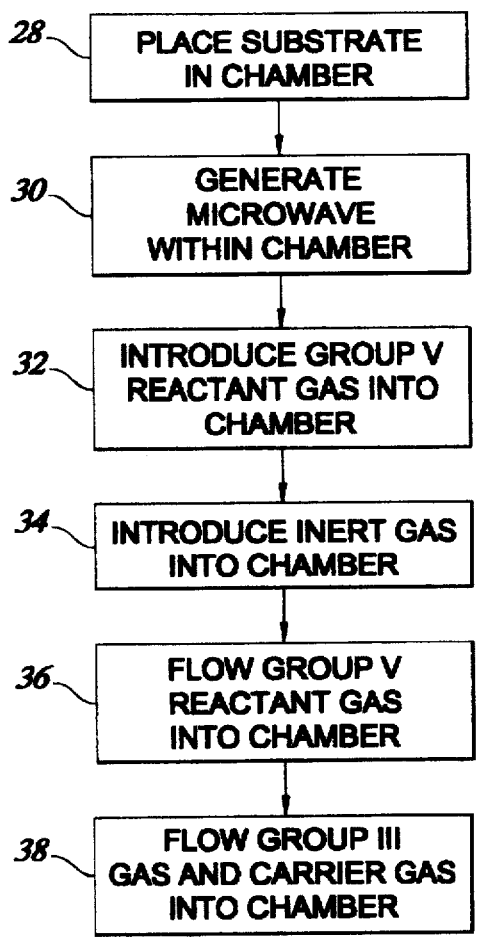
FIG. 2 is a flow chart depicting the steps of the method of the invention.

FIG. 2 is a flow chart depicting the steps of the method of employing the invention. Block 28 describes the step of placing the substrate in the chamber. Block 30 describes the step of generating microwaves within the chamber. Block 32 describes the step of introducing a reactant gas, such as ammonia, into the chamber. Block 34 describes the step of introducing an inert gas, such as xenon, into the chamber. Block 36 describes flowing a reactant gas, such as a mixture of nitrogen and ammonia, into the chamber. Block 38 describes flowing a group III gas, such as a gas containing indium, gallium, or aluminum, into the chamber.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of growing a nitride layer on a substrate, comprising the steps of:

adding a plasma gas, the gas selected from a group consisting of mercury, argon, neon, and xenon, to a chamber containing a nitrogen-bearing molecule;

exposing the nitrogen-bearing molecule and plasma gas to microwave energy, therein generating an emission of light from the plasma gas within the chamber, exposing the nitrogen-bearing molecule to the emission of light from the plasma gas, thereby disassociating a nitrogen ion from the nitrogen-bearing molecule; and placing the nitrogen ion in close proximity to a Group III receptor ion, such that the Group III receptor ion and the nitrogen ion combine to form a nitride on the substrate.

2. The method of claim 1, wherein the nitrogen-bearing molecule is ammonia.

3. The method of claim 1, wherein the receptor ion is selected from the group consisting essentially of:
   aluminum;
   gallium; and
   indium.

4. The method of claim 1, where the receptor ion is an alloy of a Group III element.

5. A method of creating a layer on a substrate, comprising the steps of:
   placing a substrate having a top in a chamber;
   generating an excitation beam within the chamber whereby a direction of the excitation beam is substantially perpendicularly directed toward the top of the substrate;
   introducing a nitrogen-bearing reactant gas that flows into the excitation beam thereby generating a plasma;
   introducing an inert gas selected from the group consisting of argon, neon, mercury, and xenon into the excitation beam thereby generating ultraviolet light, wherein the ultraviolet light assists in dissociating the nitrogen bearing reactant gas;
   flowing the nitrogen-bearing reactant gas into the chamber across the top of the substrate, whereby the plasma interacts with the nitrogen-bearing reactant gas; and
   flowing a group III gas into the chamber across the top of the substrate, whereby the plasma interacts with the group III gas, and whereby the interaction of the plasma with the nitrogen-bearing reactant gas and the group III gas causes a growth of a group III nitride layer on the substrate.

6. The method of claim 5, wherein the nitrogen-bearing reactant gas is selected from a group consisting of ammonia and a mixture of ammonia and nitrogen.

7. The method of claim 5, wherein the group III gas is gallium.

8. The method of claim 5, wherein the group III gas is a combination of gallium and indium.

* * * * *